(12) United States Patent
Sato et al.

(10) Patent No.: US 6,541,789 B1
(45) Date of Patent: Apr. 1, 2003

(54) HIGH TEMPERATURE SUPERCONDUCTOR JOSEPHSON JUNCTION ELEMENT AND MANUFACTURING METHOD FOR THE SAME

(75) Inventors: Tetsuro Sato, Tokyo (JP); Jian-Guo Wen, Tokyo (JP); Naoki Koshizuka, Tokyo (JP); Shoji Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/385,710

(22) Filed: Aug. 30, 1999

(30) Foreign Application Priority Data

Sep. 1, 1998 (JP) .......................... 10-247418
Jun. 9, 1999 (JP) .......................... 11-162025

(51) Int. Cl.[7] .............................. H01L 39/22
(52) U.S. Cl. .............................. 257/33; 257/31; 257/35
(58) Field of Search .................. 257/31–33, 35

(56) References Cited

U.S. PATENT DOCUMENTS

| | | | | |
|---|---|---|---|---|
| 3,816,845 A | * | 6/1974 | Cuomo et al. ................. | 257/32 |
| 5,100,694 A | * | 3/1992 | Hunt et al. .................... | 427/63 |
| 5,665,980 A | * | 9/1997 | Onuma et al. ................. | 257/35 |
| 5,696,392 A | * | 12/1997 | Char et al. .................... | 257/190 |
| 5,892,243 A | * | 4/1999 | Chan ............................ | 257/31 |
| 5,939,730 A | * | 8/1999 | Durand et al. ................. | 257/31 |
| 6,004,907 A | * | 12/1999 | Suh et al. ..................... | 505/329 |

FOREIGN PATENT DOCUMENTS

| | | |
|---|---|---|
| DE | 44 14 843 A1 | 11/1995 |
| JP | 01-117376 A | 5/1989 |
| JP | 3-94486 | 4/1991 |
| JP | 4-317381 | 11/1992 |
| JP | 5-327049 | 12/1993 |
| JP | 7-309700 | 11/1995 |
| JP | 8-139374 | 5/1996 |
| JP | 8-153903 | 6/1996 |
| JP | 8-148729 | 7/1996 |
| JP | 8-279630 | 10/1996 |
| JP | 7-302935 | 11/1996 |
| JP | 8-153903 | 11/1996 |
| JP | 9-232641 | 9/1997 |
| JP | 09-232641 A | 9/1997 |
| JP | 10-173246 | 6/1998 |
| WO | WO 94/07270 | 3/1994 |

OTHER PUBLICATIONS

Satoh, T., et al., "Study of in–situ Prepared High–temperature Supercondicting Edge–Type Josephson Junctions", *IEEE Transactions on Applied Superconductivity*, 7(2): 3001–3004 (1997).

Moeckly, B.H., et al., "Properties of interface–engineered high $T_c$ Josephson junctions", *Appl. Phys. Lett.*, 71(17): 2526–2528 Oct. 1997.

J. Gao, et al., "Preparation and Properties of All High $T_c$ SNS–Type Edge DC Squids," IEEE Transactions on Magnetics, vol. 27, No. 2, pp. 3062–3065 (Mar. 1991).

K. Harada, et al., "Fabrication of All–High–$T_c$ Josephson Junction Using As–Grown $YBa_2Cu_3O_x$ Thin Films," Japanese Journal of Applied Physics, vol. 30, No. 8A, pp. L1387–L1389 (Aug. 1991).

(List continued on next page.)

*Primary Examiner*—Allan R. Wilson
(74) *Attorney, Agent, or Firm*—Scully, Scott, Murphy & Presser

(57) ABSTRACT

In a method of manufacturing a Josephson junction, a first superconductive layer is formed on a substrate. An insulating film is formed on the first superconductive layer. The insulating film is etched to have an inclination portion. The first superconductive layer is etched using the etched insulating film as a mask, to have an inclination portion. A barrier layer is formed on a surface of the inclination portion of the first superconductive layer. A second superconductive layer is formed on the barrier layer and the inclination portion of the insulating layer.

11 Claims, 6 Drawing Sheets

OTHER PUBLICATIONS

D. Mateika, "Mixed–Perovskite Substrates for High–$T_c$ Superconductors," Journal of Crystal Growth, vol. 109, pp. 447–456 (1991). (No month given).

B.H. Moeckly, et al., "Properties of Interface–Engineered High $T_c$ Josephson Junctions," Applied Physics Letters, vol. 71, No. 17, pp. 2526–2528 (Oct. 1997).

B. Hunt, et al., "High–Resistance SNS Edge Junctions," 6th International Superconductive Electronics Conference, pp. 64–66 Jun. 1997.

Oh et al. Appl. Physics Letters, vol. 69, 1996 pp. 2288–2290. $Y Ba_2 Cu_3 O_{7-8}$ /$Nd Ba_2 Ca_3 O_{7-8}$ / $Y Ba_2 Cu_3 O_{7-8}$ edge junctions and SQUIDS.

* cited by examiner

ROTATION OF SUBSTRATE

ROTATION OF SUBSTRATE

ROTATION OF SUBSTRATE

HIGH TEMPERATURE SUPERCONDUCTOR JOSEPHSON JUNCTION ELEMENT AND MANUFACTURING METHOD FOR THE SAME

BACKGROUND OF THE INVENTION

1. Field of the Invention

The present invention relates to a Josephson junction device which uses a high temperature oxide superconductor and has small spread in characteristic and a manufacturing method for the same.

2. Description of the Related Art

A high temperature oxide superconductor of a YBaCuO system has a high superconductor critical temperature (Tc) of about 90 K. Therefore, a non-expensive liquid-nitrogen having the boiling point of 77 K can be used as refrigerant, and a small and handy freezer that the low temperature of about 60 K can be easily achieved can be used as a cooling means. Also, the facilities for the maintenance of the low temperature can be simplified.

Conventionally, a superconductive electronic device and circuit with a high speed and low power consumption have been realized using a material such as Nb having a low superconductor critical temperature Tc. For the above reasons, if the device and circuit are possible to be realized using the high temperature superconductor, it contributes greatly to the industry.

A superconductor of a YBaCuO system is a main object for the study and development of application to the electronic device at present. The YBaCuO system high temperature superconductor thin film indicative of a good superconductive characteristic can be obtained through vapor-phase growth under the condition of the high substrate temperature of 600 to 800° C. and the high oxygen partial pressure in the order of 100 mTorr. One of the superconductive thin films having especially good characteristic has c-axis orientation in which a c-axis of its crystal structure is perpendicular to the substrate surface. On the other hand, depending on the growth condition, it is possible to form an a- or b-axis orientation film. However, the a- or b-axis orientation film is inferior in the superconductive characteristics such as the superconducting critical temperature Tc and the superconducting critical current value Ic, compared with the c-axis orientation film.

A substrate formed of $SrTiO_3$, MgO, $LaAlO_3$ or $NdGaO_3$ is generally used for the growth of the superconductive thin film in consideration of matching with YBaCuO in lattice constant and thermal expansion coefficient and non-occurrence of solid phase reaction. Also, LaSrAlTaO is used as the substrate, since it has a good lattice matching with YBaCuO and has a low dielectric constant and a relatively large substrate can be formed, as shown in, for example, Journal of Crystal Growth, Vol. 109, pp.447–456, 1991.

The YBaCuO system has a strong anisotropic characteristic like the other high temperature superconductors. The superconductive coherence length is longer in the a- or b-axis direction than in the c-axis direction. The coherence length in the c-axis direction is as very short as about 0.3 nm. Therefore, it is desirable to flow a current in the a- or b-axis direction in wiring sections and Josephson junctions in the superconductor circuit using a high temperature superconductor.

For these reasons, when a high temperature superconductor electronic circuit is manufactured using the high quality c-axis orientation thin film, it is difficult to manufacture the Josephson junction of the high quality in a sandwich type Josephson junction in which it is necessary to flow current in the film thickness direction, i.e., in the c-axis direction of the high temperature superconductor crystal, unlike the conventional superconductor circuit using Nb. In this case, an edge type Josephson junction device using an edge part of the superconductive thin film is suitable rather than the sandwich type Josephson junction device, as shown in "IEEE TRANSACTIONS ON MAGNETICS, VOL.27, NO.2, MARCH, 1991, pp.3062–3065". Therefore, the study and development of the high temperature superconductor circuit is mainly performed using the edge type Josephson junction device.

In the high temperature superconductor Josephson junction device, the technique is not established for forming a very thin barrier layer as an $Al_2O_3$ barrier layer used in the Nb system Josephson junction device having a low critical temperature Tc. Therefore, a non-superconductive oxide film such as a PrBaCuO system film and a superconductive oxide film such as a Co doped YBaCuO system film are deposited on a lower superconductive layer as a barrier layer. The PrBaCuO system crystal has a similar crystal structure to the YBaCuO system crystal and the PrBaCuO system non-superconductor oxide is easy to heteroepitaxially grow on the YBaCuO layer. Also, the Co doped YBaCuO system superconductive film has a critical temperature Tc lower than YBaCuO superconductive film.

In the above, there is a problem in the spread of junction characteristics such as a superconductive critical current value Ic in a high temperature superconductor Josephson junction device. In the barrier layer forming method using the thin film growth method, it is difficult to grow the thin barrier layer sufficiently uniformly. As a result, the coverage of the lower superconductive layer by the barrier layer is low, so that the spread of the characteristics is large between the junctions. For this reason, the study of the high temperature superconductor Josephson junction device is accomplished by use of an interface control technique without using thin film growth technique, as shown in "APPLIED PHYSICS LETTERS, VOL.71, NO.17, OCTOBER, 1997, pp.2526–2528". In this method, after the lower superconductive layer is etched to a predetermined shape, a combination of an annealing process in a vacuum and the irradiating process of accelerated ions is performed. Through the combination process, the surface portion of the lower superconductive layer is changed in the crystal structure to have a function as the barrier layer. However, there is the spread of critical current value Ic of ($1\sigma=\pm8\%$) even in the 10 samples of the high temperature superconductor Josephson junction device manufactured by the above method.

Also, as the superconductive material for the high temperature superconductor Josephson junction device, a copper oxide system material is used and is practicable in the high temperature region. In this case, however, it is especially difficult to form the barrier layer. Because the coherence length is as short as about 1 to 2 nm in the copper oxide system material, it is necessary that the barrier layer of the Josephson junction also has the film thickness approximately equal to the coherence length. When the film thickness of the barrier layer becomes thicker than the above coherence length, the Josephson current becomes difficult to flow and the quality of the Josephson junction is degraded. As a result, the function sometimes becomes not attained. However, in the conventional method, it is very difficult to form the barrier layer of such a thin film in actual.

In conjunction with the above description, a Josephson junction device and a manufacturing method for the same are disclosed in Japanese Laid Open Patent Application (JP-A-Heisei 3-94486). In this reference, a high temperature oxide superconductor of $LnBa_2Cu_3O_{7-\delta}$ and an insulator of $Ln_2BaCuO_5$ which is composed of the same elements as the superconductor are continuously formed in a sputtering apparatus. Then, an annealing process is carried out at a predetermined temperature in an oxygen atmosphere to produce a Josephson junction device.

Also, a method of manufacturing a barrier layer type electronic device is disclosed in Japanese Laid Open Patent Application (JP-A-Heisei 4-317381). In this reference, a YBaCuO oxide superconductor thin film is formed on a substrate. The forming process is carried out by a CVD method, a sputtering method or a vapor deposition method. Next, Fe ions are injected into the oxide superconductor thin film, and the injected ions are diffused in the internal direction of the thin film by a heating process to form a barrier layer. Next, the surface of the barrier layer which has received physical damage through the ion implantation is removed. After that, a YBaCuO oxide superconductor thin film is formed on the barrier layer as a counter electrode of the oxide superconductor thin film.

Also, in Japanese Laid Open Patent Application (JP-A-Heisei 10-173246) is disclosed a high temperature SSNS, an SNS Josephson junction device and a manufacturing method for the same. In this reference, a first superconductive (HTS) layer of the high critical temperature Tc is formed on a substrate, and a first dielectric layer is formed on the HTS layer. The first HTS layer and the dielectric layer have an inclined edge. A 3-layer SNS structure is arranged on the inclined edge to form 4-layer SSNS junction.

Also, the study result of the factor which influences on the resistance of the SNS edge junction using Co-doped YBaCuO as a usual metal layer is described in "High-Resistance SNS Edge Junctions" by Brian D. Hunt (6th International Superconductive Electronics Conference 1997).

SUMMARY OF THE INVENTION

Therefore, an object of the present invention is to provide a high temperature superconductor Josephson junction device in which a barrier layer having a uniform film thickness and composition can be formed with good reproducibility and with a small spread and which is superior in characteristic.

Another object of the present invention is to provide a Josephson junction device in which a good barrier layer can be formed using a copper oxide system material as a superconductive material, and which is practicable in a higher temperature.

In order to achieve an aspect of the present invention, a method of manufacturing a Josephson junction include:

forming a first superconductive layer on a substrate;

forming an insulating film on the first superconductive layer;

etching the insulating film to have an inclination portion;

etching the first superconductive layer using the etched insulating film as a mask, to have an inclination portion;

forming a barrier layer on a surface of the inclination portion of the first superconductive layer; and forming a second superconductive layer on the barrier layer and the inclination portion of the insulating layer.

In order to achieve another aspect of the present invention, a method of manufacturing a Josephson junction include:

forming a first superconductive layer on a substrate;

forming an insulating film on the first superconductive layer;

etching the insulating film and the first superconductive layer to have an inclination portion;

forming a barrier layer on a surface of the inclination portion of the first superconductive layer; and forming a second superconductive layer on the barrier layer and the inclination portion of the insulating layer.

In the above, the first superconductive layer and the second superconductive layer preferably are a copper oxide system superconductive layer. In this case, the copper oxide system superconductive layer may be YBaCuO superconductive layer.

Also, the second superconductive layer may be formed in a same sample chamber without being exposed to an atmosphere, after the inclination portion of the first superconductive layer is formed.

Also, the barrier layer preferably has a film thickness equal to or less than 2 nm. Also, the barrier layer preferably has a perovskite structure. In this case, a material of the barrier layer may have a lattice constant from 0.41 nm to 0.43 nm.

Also, the insulating film may contain at least one element selected from the group consisting of La, Sr, Al, Ca and Ta.

Also, a composition of the barrier layer may be $Y_{1-x}Ba_1Cu_xO_y$ (x being in a range of 0 to 1). Especially, x may be equal to or less than 0.5 or 0.

Also, the barrier layer preferably includes at least one element selected from the group consisting of La, Sr, Al, Ca and Ta which are supplied from the insulating layer or the substrate.

Also, the first superconductive layer and the insulating layer are formed by a pulsed laser deposition method.

Also, the first superconductive layer may be formed at a first substrate temperature, and the insulating layer may be formed at a second substrate temperature lower than the first substrate temperature.

Also, the etching of a first superconductive layer may include etching the first superconductive layer while inert gas ions are irradiated. In this case, the etching a first superconductive layer may include etching the first superconductive layer while inert gas ions are irradiated and the substrate is rotated.

Also, the etching a first superconductive layer and an insulating layer may include etching the first superconductive layer and the insulating layer while inert gas ions are irradiated. In this case, the etching a first superconductive layer and an insulating layer may include etching the insulating layer and the first superconductive layer while inert gas ions are irradiated and the substrate is rotated.

Also, the insulating layer may be etched while the first superconductive layer is etched such that at least one of the elements of the insulating layer is re-deposited on a surface of the inclination portion of the first superconductive layer.

Also, the forming a barrier layer may include ion-etching a surface of the inclination portion of the insulating film and a surface of the inclination portion of the first superconductive layer. At this time, the ion-etching may include ion-etching the surface of the inclination portion of the insulating film and the surface of the inclination portion of the first superconductive layer, such that at least one of elements of the insulating layer is re-deposited on the surface of the inclination portion of the first superconductive layer. In this case, a surface portion of the inclination portion where the at least one element is re-deposited may form an amorphous layer.

Also, the method may further include heating the substrate in an oxygen atmoshere and crystallizing the surface-portion of the inclination portion where the at least one element is re-deposited. In this case, the crystallizing may be a part of the forming a second superconductive layer.

Also, the method may further include changing a structure and composition of a surface portion of the inclination portion of the first superconductive layer through an ion irradiation damage. In this case, the changing may include crystallizing the surface portion of the inclination portion of the first superconductive layer, while a heating is carried out to the first superconductive layer in an oxygen atmosphere.

In order to achieve still another object of the present invention, a method of manufacturing the Josephson junction include:

forming a first superconductive layer on a substrate;

forming an interlayer insulating layer on the first superconductive layer;

forming a second superconductive layer on the interlayer insulating layer as a barrier layer;

etching the second superconductive layer and the barrier layer to form 2 or more electrodes; and forming an insulating layer between the 2 or more electrodes.

The first superconductive layer and the second superconductive layer are a copper oxide system superconductive layer. In this case, the copper oxide system superconductive layer is YBaCuO superconductive layer. In this case, the barrier layer has a film thickness equal to or less than 2 nm.

The method may further include carrying out ion irradiation to a surface portion of the first superconductive layer to give a damage to the surface portion of the first superconductive layer, before the barrier layer is formed on the first superconductive layer. In this case, the carrying out ion irradiation may include carrying out the ion irradiation at a temperature of the substrate in a range of room temperature to 700° C.

In order to achieve yet still another aspect of the present invention, a Josephson junction include a first superconductive layer formed on a substrate and having an inclination portion, an insulating film formed on the first superconductive layer and having an inclination portion following to the inclination portion of the first superconductive layer, a barrier layer formed on the inclination portion of the first superconductive layer, and having a film thickness equal to or less than 2 nm, and a second superconductive layer formed on the inclination portion of the insulating film and the inclination portion of the barrier layer.

In the above, the first superconductive layer and the second superconductive layer may be a copper oxide system superconductive layer. In this case, the copper oxide system superconductive layer may be YBaCuO superconductive layer.

The barrier layer may have a perovskite structure. In this case, a material of the barrier layer may have a lattice constant from 0.41 nm to 0.43 nm.

Also, the insulating film may contain at least one element selected from the group consisting of La, Sr, Al, Ca and Ta.

Also, a composition of the barrier layer is $Y_{1-x}Ba_1Cu_xO_y$ (x being in a range of 0 to 1). The value of x may be equal to or less than 0.5 or 0.

In order to achieve another aspect of the present invention, a Josephson junction device includes a first superconductive layer formed on a substrate, 2 or more interlayer insulating films provided on the first superconductive layer to be apart from each other and having a film thickness equal to or less than 2 nm, 2 or more second superconductive layers respectively formed on the interlayer insulating layers.

In the above, the first superconductive layer and the second superconductive layer may be a copper oxide system superconductive layer. The copper oxide system superconductive layer may be YBaCuO superconductive layer.

In order to achieve still another aspect of the present invention, a method of manufacturing a Josephson junction, wherein a material of an insulating layer which is formed on a first superconductive layer is diffused into the first superconductive layer to form a barrier layer on a surface portion of the first superconductive layer, and a second superconductive layer is formed on the barrier layer to form a Josephson junction.

DESCRIPTION OF THE PREFERRED EMBODIMENTS

Figure 1:
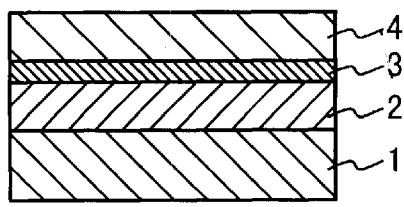
FIG. 1 is a diagram of about the characteristic part of the way of the present invention.

A barrier layer in the present invention is a layer which is arranged between upper and lower superconductive layers. The barrier layer has a characteristic as semiconductor or insulator in the temperature dependence. The resistivity of the barrier layer at the room temperature (25° C.) is equal to 1 mΩcm or more. It is desirable that the barrier layer has the film thickness equal to or less than 10 nm in order to show the function. The lower limit of the film thickness is not especially defined. The barrier layer is typically sufficient to have the thickness of about 1 atom layer although depending on the material of the barrier layer. It should be noted that it is desirable for the film thickness of the barrier layer to be equal to or less than about 2 nm, when the copper oxide system material is used for the superconductive layer.

In the present invention, "diffusion" means that non-superconductive material elements or ions given with a predetermined kinetic energy are physically introduced into a layer and that the elements or ions are thermally diffused in the layer.

Also, in the present invention, "change in material" means that the surface portion of the material layer is changed in structure and is physically changed in composition by the non-superconductive material elements or ions having the predetermined kinetic energy given.

The superconductive material of the present invention is preferable to be of a copper oxide system. When the copper oxide system material is used as the superconductive material, the Josephson junction device can be practicable in a high temperature region. As mentioned above, when the copper oxide system material is used, there is a peculiar problem that the forming of the barrier layer becomes especially difficult because of the short coherence length. In the present invention, the problem is solved by at least one of the following ways. That is, ① the non-superconductive material is re-deposited to the surface of the lower superconductive layer and the barrier layer is formed through the diffusion of the non-superconductive material elements or ions. Or, ② the material which contains specific elements is selected as the non-superconductive material for the barrier layer. Otherwise, ③ the surface portion of the lower superconductive layer is changed in material through ion irradiation. It should be noted that YBaCuO is preferable as the material of the above copper oxide system. It is especially easy for elements of the non-superconductive material such as La, Sr, Al, Ta and Ca to diffuse into the YBaCuO layer. Therefore, the barrier layer having a uniform film thickness and composition can be formed in the YBaCuO layer or on the surface portion of the YBaCuO layer.

In the present invention, it is preferable that the material of the barrier layer has the perovskite structure. Epitaxial growth becomes easier in this way. Especially, the epitaxial growth on the YBaCuO layer becomes better. Thus, the uniformity of the composition and film thickness of the barrier layer can be improved.

Also, in the present invention, a mask material for ion etching, an interlayer insulating layer and a substrate may contain at least one of the elements of La, Sr, Al, Ta and Ca. Thus, at least one of elements is diffused into the lower superconductive layer when the edge portion of the lower superconductive layer is formed through the ion etching. Also, in the present invention, when the edge surface portion of the lower superconductive layer is cleaned by the ion etching, any of the above elements such as La, Sr, Al, Ta and Ca are exposed the surface portion of the substrate or interlayer insulating layer. In this case, the exposed elements are possible to be supplied to the lower superconductive layer through the phenomena such as re-depositing the exposed elements on the surface of the lower superconductive layer and the surface diffusion. It should be noted that these elements may be supplied from an external vapor source. For example, when YBaCuO is used as the material for the lower superconductive layer, the above-mentioned elements are mixed with the elements such as Y, Ba, Cu and O in the surface portion of the lower superconductive layer through the ion irradiation. The mixed elements are crystallized through a heating process. In this way, the uniform barrier layer is formed on the edge portion of the lower superconductive layer. As a result, the high temperature superconductor edge type Josephson junction device having high uniformity can be manufactured.

Also, a thin film containing the elements such as La, Sr, Al, Ta and Ca may be deposited as the barrier layer on the lower superconductive layer and the upper superconductive layer may be deposited on the barrier layer. In this way, the uniform barrier layer can be formed on the lower superconductive layer, so that the high temperature superconductor sandwich type Josephson junction device having high uniformity can be manufactured. It should be noted that accelerated ions are irradiated to the lower superconductive layer surface or the barrier layer. At this time, the material in the surface portion of the lower superconductive layer and at least one of the above-mentioned elements can be effectively mixed, so that the more uniform barrier layer can be formed.

Hereinafter, the Josephson junction device of the present invention will be described below in detail.

FIG. 1 shows a cross sectional view of the Josephson junction device of the present invention. Referring to FIG. 1, the Josephson junction device of the present invention is composed of a lower superconductive layer 2, a barrier layer 3 and an upper superconductive layer 4 which are provided onto a substrate 1 in this order. The barrier layer is sandwiched between the lower superconductive layer and the upper superconductive layer. The barrier layer is composed of two layers: one layer being composed of the material which contains at least one of elements such as La, Sr, Ca, Al and Ta, and the other layer being formed with at least one of the above elements diffused in the lower superconductive layer. By adopting such a structure, the barrier layer having the uniform film thickness and composition can be formed with reproducibility. Therefore, the upper and lower superconductive layers never forms a short-circuit when the barrier layer is very thin. If the Josephson junction is manufactured to use such a structure, the Josephson junction devices with well characteristics can be manufactured.

FIGS. 2A to 2G show a method of manufacturing the high temperature superconductor edge type Josephson junction device according to the first embodiment of the present invention.

Figure 2A:
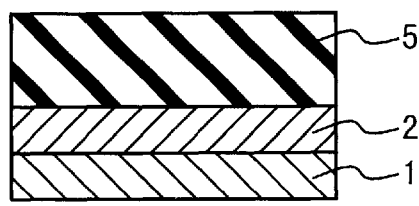
FIGS. 2A to 2G are diagrams of a manufacturing method of a high temperature superconductor edge type Josephson junction according to a first embodiment of the present invention.

Referring to FIG. 2A, first, a bi-layer film growth process will be described. The lower superconductive layer 2 of $YBa_2Cu_3O_x$ is formed on the substrate 1 and the insulating layer 5 of LaSrAlTaO is formed on the lower superconductive layer 2. Thus, the 2-layer thin film is formed. The two thin film layers are grown by a pulsed laser deposition method. The laser is an excimer laser of KrF. The laser wavelength was 248 nm, the laser output was 900 mJ and the laser repetition frequency was 7 Hz. As the thin film growth method, other methods such as a sputtering method and various deposition methods such as an electron beam deposition method and a deposition method using a heat source may be used.

A LaSrAlTaO (100) single crystal is used as the substrate 1. The composition of the substrate was $(La_{0.30}Sr_{0.70})(Al_{0.65}Ta_{0.35})O_3$. The size of the substrate was the square of 15 mm×15 mm and the thickness was 0.5 mm. The lower superconductive layer 2 of $YBa_2Cu_3O_x$ was first grown on the substrate 1 in a film growing chamber to have the film thickness of about 300 nm. A sintered target of the composition of $YBa_2Cu_3O_x$ was used as a target. The substrate temperature during the growth was about 700° C., and the ambience gas is an oxygen gas and has the oxygen partial pressure of about 200 mTorr. The grown thin film was a c-axis orientation thin film, there was hardly any phase other than $YBa_2Cu_3O_x$ and the surface of the thin film was flat. Also, the superconductor critical temperature Tc is in a range of about 85 to 89 K.

After the lower $YBa_2Cu_3O_x$ superconductive layer 2 was grown, the interlayer insulating layer 5 of LaSrAlTaO was formed in the same film growing chamber to have the film thickness of about 600 nm. At this time, a single crystal of LaSrAlTaO was used as the target. The composition of the single crystal target was $(La_{0.30}Sr_{0.70})(Al_{0.65}Ta_{0.35})O_3$. Another composition may be used if the composition is in a range of $(La_{0.30\pm0.20}Sr_{0.70\pm0.20})(Al_{0.65\pm0.20}Ta_{0.35\pm0.20})O_{3\pm1}$. The substrate temperature was set to a temperature lower by 10 to 20° C. than the substrate temperature of the growth of the $YBa_2Cu_3O_x$ layer, and the oxygen partial pressure was 100 mTorr. After the bi-layer thin film layer has been grown, the substrate was cooled for about 1 hour in the oxygen ambient gas of 500 Torr and then was taken out from the film growing chamber.

The film growth condition and the film thickness described above may be changed if the good Josephson junction is attained. Also, the target may be a sintered body but the single crystal target is more desirable. This is because the sintered body is lower in density than the single crystal. As a result, fine particles are sometimes formed on the thin film peculiar to the pulsed laser deposition method in a higher density.

Next, the forming process of the edge structure by an etching method will be described. The etching process is classified into a first process of forming an etching mask from the LaSrAlTaO interlayer insulating layer, and a second process of forming a superconductive edge portion using the mask.

First, the first etching process will be described below. A photoresist layer was spin-coated onto the 2-layer thin film of LaSrAlTaO/$YBa_2Cu_3O_x$ by 1.2 $\mu$m. The photoresist layer was patterned by use of the usual photolithography method. At this time, a portion of the interlayer insulating layer pattern which functions as the edge junction was etched to be parallel to [100] or [010] direction of the substrate crystal structure.

Figure 2B:
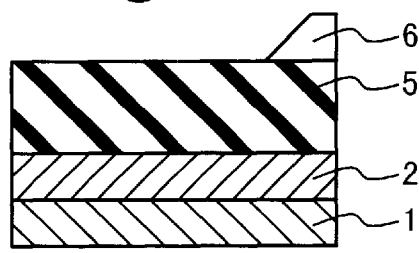

As shown in FIG. 2B, after the patterning, a reflow process of the photoresist layer was carried out for 20 minutes at 160° C. As a result, the end portion of photoresist layer 6 was rounded to have a gentle inclination.

Figure 2C:
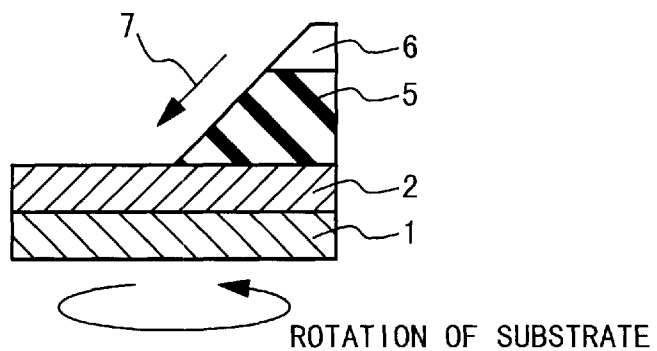

Next, as shown in FIG. 2C, the interlayer insulating layer 5 was etched by an ion milling method so that the LaSrAlTaO mask was formed for the superconductive layer edge portion. In this process, Ar ions 7 were irradiated at the angle of about 30 degrees from the substrate surface while the substrate is rotated. This angle may be an angle other than 30 degrees as far as the inclination angle of the superconductive layer edge portion finally formed becomes too large so that crystal grains having different orientations grow on the inclined edge portion. Also, the ion acceleration voltage was 400 V and the ion current was 50 mA.

Figure 2D:
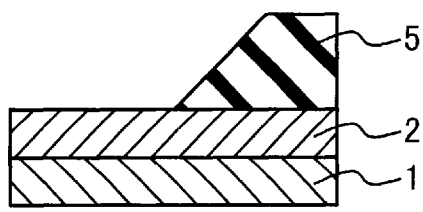

Next, as shown in FIG. 2D, after the etching process, the substrate was supersonic-cleaned using acetone and then isopropanol, so that the photoresist layer was dissolved and removed. Finally, the substrate was cleaned for 30 minutes in an oxygen plasma activated in 400-W RF.

Next, the second etching process will be described.

Figure 2E:
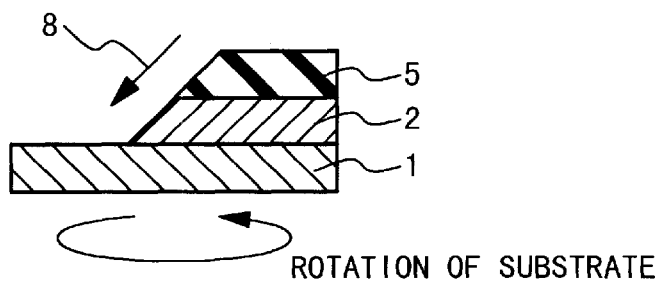

As shown in FIG. 2E, in this process, the lower superconductive layer 2 of $YBa_2Cu_3O_x$ was etched using the interlayer insulating layer 5 of LaSrAlTaO as a mask to produce the superconductive layer edge portion. In this process, Ar ions 8 were irradiated at the angle of about 45 degrees from the substrate surface while the substrate was rotated. Because the incident angle of the Ar ions does not have a large influence to the angle of the edge portion in this etching process, the incident angle may be in a range of approximately 20 to 60 degrees. Also, the ion acceleration voltage was 200 V and the ion current was 15 mA. In order to prevent oxygen depletion from the surface of the superconductive layer edge portion, the etching was carried out while the oxygen activated with the microwave of 2.45 GHz and 120 W was directed at the substrate.

The interlayer insulating layer 5 was etched in the second etching process and the elements such as La, Sr, Al and Ta were sputtered and re-deposited onto the surface of the lower superconductive layer 2. The elements re-deposited to the surface such as La, Sr, Al and Ta were thermally diffused in the forming process of the upper superconductive layer 4 and then the barrier layer 3 containing at least one of the elements such as La, Sr, Al and Ta was formed.

After the etching process, in order to reduce an etching damage to the edge surface, a cleaning process by low acceleration ions was carried out while the substrate is rotated. In this case, the ion acceleration voltage was 50 V, the ion current was 10 mA, and the cleaning time was 10 minutes. The activated oxygen was introduced in the cleaning process, too, as described above. It should be noted that this cleaning process is not an indispensable process to manufacture the high temperature superconductor Josephson junction device with a small spread.

Through the above two etching processes, the same superconductive layer edge portions were formed in 4 directions parallel to [100] or [010] direction of the substrate. The angle of the completed edge portion is about 25 degrees.

Because the LaSrAlTaO interlayer insulating layer itself is used as the mask in the second etching process, the mask removal process is unnecessary. Therefore, after the etching process ends in an etching chamber, the sample can be transferred to a film growing chamber and is possible to enter a film forming process. Because the etching chamber and the film growing chamber are connected through a transfer tube, the sample can be transferred without exposing the surface of the superconductive layer edge portion to the atmosphere, so that the contamination of the edge portion surface can be prevented.

After the substrate temperature was increased to about 700° C. again, the upper superconductive layer 4 of $YBa_2Cu_3O_x$ was grown on this structure to have the film thickness of about 400 nm. The condition at the growth of this layer is the same as that at the growth of the lower superconductive layer 2.

Figure 2F:
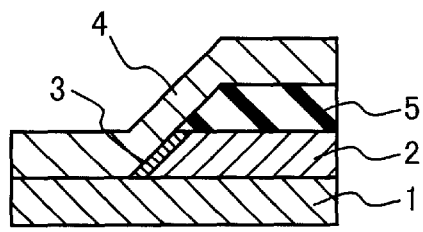

As shown in FIG. 2F, through the above process, the barrier layer 3 was formed between the upper and lower superconductive layers to be composed of the material contains at least four elements of La, Sr, Al and Ta. There is a case where it is requested that a barrier layer is thicker than the above barrier layer. In this case, the barrier layer can be made thicker by depositing the material containing at least one of elements of La, Sr, Al and Ta, more preferably at least four of the elements on the lower superconductive layer 2. This additional barrier layer may be grown under the same condition as that at the time of growth of the lower superconductive layer 2. In this case, the substrate temperature may be in a range from the room temperature to 700° C.

Figure 2G:
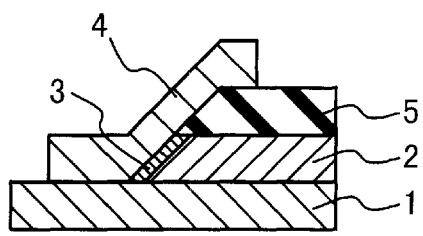

As shown in FIG. 2G, after the upper superconductive layer 4 of $YBa_2Cu_3O_x$ was grown, the sample was cooled for about 1 hour in the oxygen ambience of 500 Torr and then taken out. The upper superconductive layer 4 was processed by the usual lithography method and the ion milling method so as to produce the edge type Josephson junction device in which the upper and lower superconductive layers were connected through the barrier layer 3. Lastly, contact pads are formed through gold deposition and a lift-off method.

The characteristics of the edge type Josephson junction manufactured in this way were evaluated. Either of the samples showed good Josephson characteristics. Shapiro steps appeared in the theoretical voltage in response to microwave irradiation. Also, the periodic modulation of the critical current by magnetic field was observed. The current—voltage characteristic approximately showed an over-dump type characteristic. However, it showed a hysteresis in the low temperature up to about 40 K. The product (IcRn) of the critical current and normal conductive resistance was in a range of about 2 to 2.5 mV at 4.2 K and about 0.1 mV at 60 K. A characteristic spread of the samples was small. The spread of the 12 samples in critical current density is $1\sigma = \pm 6\%$ and the spread of the 100 samples in critical current density is 1σ=±8%. These values can be obtained through the above-mentioned manufacturing processes, because the high temperature superconductor edge type Josephson junction device is manufactured to have high uniformity.

From the cross-sectional observation result of the Josephson junction device by a high resolution transmission electron microscope and the composition analysis result by an energy dispersive X-ray analysis method, the following matters became clear. That is, it was confirmed that the barrier layer was formed at the interface between the upper and lower superconductive layers to have the film thickness of about 2 nm. The structure of the material of the barrier layer is inferred to be a perovskite structure of a cubic symmetry. The lattice constant is in a range of 0.41 to 0.43 nm.

Also, in the composition, Y increases from the composition of $YBa_2Cu_3O_x$ as the composition of the lower superconductive layer, and Cu shifts onto the decreasing side. An average of analysis values on the 10 analysis points was Y:Ba:Cu=30:43:27 (if being $YBa_2Cu_3O_x$ composition, it is Y:Ba:Cu=17:33:50).

Because the barrier layer is very thin, information of the upper and lower superconductive layers of $YBa_2Cu_3O_x$ is contained in this analysis result. Therefore, this analysis result must not be interpreted as composition of the barrier layer itself.

Supposing that the barrier layer material has the perovskite structure, the composition is represented as being $ABO_3$. An ion having relatively large radius occupies the site A and an ion having relatively small radius occupies the site B. Considering from the analysis result for this time and the ion radii ($Y^{3+}$: 0.89 Å, $Ba^{2+}$: 1.34 Å, $Cu^{2+}$: 0.72 Å), the barrier layer material is supposed to be $Y_{1-x}Ba_1Cu_xO_y$.

The edge surface immediately after the formation was subjected to the similar observation and analysis. The state of "Immediately after the formation" means the state in which an Au layer as a dummy layer for the TEM sample is deposited at the room temperature and the edge portion surface is not subjected to any annealing process.

An amorphous layer with the film thickness in a range of 1 to 2 nm which was substantially the same as the barrier layer was observed in the edge portion surface. Also, the composition of the amorphous layer is substantially the same as that of the above-mentioned barrier layer. Therefore, it became clear that composition change occurred in the amorphous state. It should be noted that there were some examples that Cu was hardly detected in the composition analysis of the amorphous layer. Because the Au layer was formed on the one side of the amorphous layer in this sample, the influence of $YBa_2Cu_3O_x$ to the analysis result is smaller than in the above case. From this result, there is the possibility that Cu ions are not only decreased compared with $YBa_2Cu_3O_x$ in the amorphous layer, but also Cu ions are almost lost. This is also possible to say to the finally formed barrier layer.

From the above result, a barrier layer forming mechanism is supposed as follows.

That is, in case that the edge portion is formed by the ion etching method, the edge portion surface suffers a damage by the ion irradiation, when the edge portion is completed. As a result, the edge portion is covered with the amorphous layer. In the composition of this amorphous layer, Y is increased from the composition of $YBa_2Cu_3O_x$ by the preferential sputtering phenomena, and Cu shifts to the side where Cu decreases. In this case, there is the possibility that Cu ions are approximately completely lost. It could be considered that this amorphous layer is heated through the substrate temperature increase for growth of the upper superconductive layer, and crystallized to form the barrier layer.

Last, the effect that Cu ions are decreased in the amorphous layer on the edge portion surface would be considered.

In the case of the thin film growth of $YBa_2Cu_3O_x$, it is known that when the Cu composition of the thin film composition becomes about 3 or more, a large $BaCuO_x$ precipitates are produced in the thin film so that the flatness of the thin film is degraded. From this viewpoint, because the generation of these precipitates are restrained, it is preferable that there are few Cu ions in the amorphous layer for the barrier layer with the uniform film thickness.

When the substrate of SrTiO or MgO was used instead of the substrate of LaSrAlTaO, the Josephson junction device was similarly formed. However, the spread of critical current value Ic and the critical current value were both large. Even when the substrate of LaSrAlTaO was used, the critical current value Ic of the junction was very large so that the Josephson junction were not formed, if the material of SrTiO, MgO or SrAlTaO was used for the interlayer insulating layer. When the formation of a Josephson junction is tried in these cases, it is necessary to decrease the growth temperature of the upper superconductive layer lower from being general. Therefore, the superconductive characteristic of the upper superconductive layer is degraded. In this way, it is important to use the material containing the elements such as La, Sr, Al and Ta for the interlayer insulating layer. The interlayer insulating layer, which is used for the mask at the time of the ion etching process for the purpose of manufacturing of the Josephson junction device with the small spread of characteristics. If the material containing the elements such as La, Sr, Al and Ta is used for the substrate, it is still desirable.

It should be noted that if a $(La_{0.20}Ca_{0.80})(Al_{0.60}Ta_{0.40})O_3$ target is used instead of the $(La_{0.30}Sr_{0.70})(Al_{0.65}Ta_{0.35})O_3$ target, a LaCaAlTaO interlayer insulating layer is grown instead of the LaSrAlTaO interlayer insulating layer. In this case, the high temperature superconductor Josephson junction with the small spread of the characteristics can be manufactured in the same manner as described above.

FIGS. 3A to 3G show the manufacturing method of the high temperature superconductor edge type Josephson junction device according to the second embodiment of the present invention. In the second embodiment, the interlayer insulating thin film and the lower superconductive layer are collectively etched.

Figure 3A:
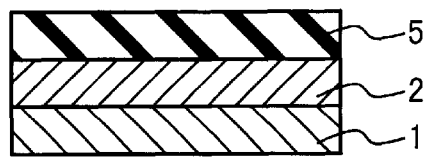
FIGS. 3A to 3G are diagrams of a manufacturing method of the high temperature superconductor edge type Josephson junction according to a second embodiment of the present invention.

Referring to FIG. 3A, first, a bi-layer film growth process will be described. The lower superconductive layer 2 of $YBa_2Cu_3O_x$ is formed on the substrate 1 and the insulating layer 5 of LaSrAlTaO is formed on the lower superconductive layer 2. Thus, the 2-layer thin film is formed. The two thin film layers are grown by a pulsed laser deposition method. The laser is an excimer laser of KrF. The laser wavelength was 248 nm, the laser output was 900 mJ and the laser repetition frequency was 7 Hz. As the thin film growth method, other methods such as a sputtering method and various deposition methods such as an electron beam deposition method and a deposition method using a heat source may be used.

A LaSrAlTaO (100) single crystal is used as the substrate 1. The composition of the substrate was $(La_{0.30}Sr_{0.70})(Al_{0.65}Ta_{0.35})O_3$. The size of the substrate was the square of 15 mm×15 mm and the thickness was 0.5 mm. The lower superconductive layer 2 of $YBa_2Cu_3O_x$ was first grown on the substrate 1 in a film growing chamber to have the film thickness of about 300 nm. A sintered target with the composition of $YBa_2Cu_3O_x$ was used as a target. The substrate temperature during the growth was about 700° C., and the ambience gas is an oxygen gas and has the oxygen partial pressure of about 200 mTorr. The grown thin film was a c-axis orientation thin film, there was hardly any phase other than $YBa_2Cu_3O_x$ and the surface of the thin film was flat. Also, the superconductor critical temperature Tc is in a range of about 85 to 89 K.

After the lower superconductive layer 2 of $YBa_2Cu_3O_x$ was grown, the interlayer insulating layer 5 of LaSrAlTaO was formed in the same film growing chamber to have the film thickness of about 300 nm. At this time, a single crystal of LaSrAlTaO was used as the target. The composition of the single crystal target was $(La_{0.30}Sr_{0.70})(Al_{0.65}Ta_{0.35})O_3$. Another composition may be used if the composition is in a range of $(La_{0.30\pm0.20}Sr_{0.70\pm0.20})(Al_{0.65\pm0.20}Ta_{0.35\pm0.20})O_{3\pm1}$. The substrate temperature was set to a temperature lower by 10 to 20° C. than the substrate temperature of the growth of the lower superconductive layer 2 of $YBa_2Cu_3O_x$, and the oxygen partial pressure was 100 mTorr. After the bi-layer thin film layer has been grown, the substrate was cooled for about 1 hour in the oxygen ambient gas of 500 Torr and then was taken out from the film growing chamber.

The film growth condition and the film thickness described above may be changed if the good Josephson junction is attained.

Next, the forming process of the edge structure by an etching method will be described.

First, a photoresist layer was spin-coated onto the 2-layer thin film of $LaSrAlTaO/YBa_2Cu_3O_x$ by 1.2 $\mu$m. The photoresist layer was patterned by use of the usual photolithography method. At this time, a portion of the 2-layer thin film pattern which functions as the edge junction was etched to be parallel to [100] or [010] direction of the substrate crystal structure.

Figure 3B:
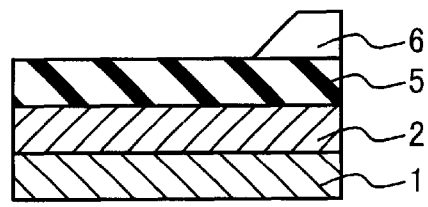

As shown in FIG. 3B, after the patterning, a reflow process of the photoresist layer was carried out for 20 minutes at 160° C. As a result, the end portion of patterned photoresist layer 6 was rounded to have a gentle inclination.

Figure 3C:
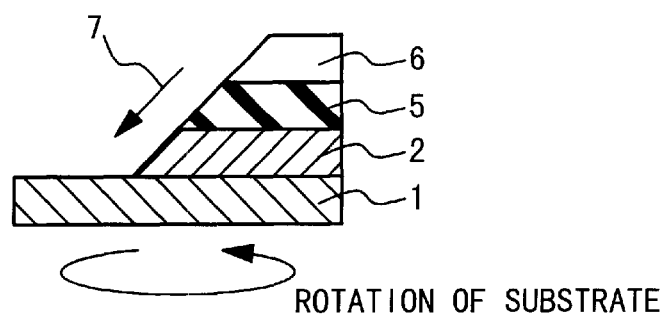

Next, as shown in FIG. 3C, the interlayer insulating layer 5 and the lower superconductive layer 2 of YBa2Cu3Ox were etched by an ion milling method so that the edge portion of the superconductive layer was formed. In this process, Ar ions 7 were irradiated at the angle of about 30 degrees from the substrate surface while the substrate is rotated. This angle may be an angle other than 30 degrees as far as the inclination angle of the superconductive layer edge portion finally formed becomes too large so that crystal grains having different orientations grew on the inclined edge portion. Also, the ion acceleration voltage was 400 V and the ion current was 50 mA. In this process, the elements such as La, Sr, Al and Ta were sputtered from the interlayer insulating film 5 by etching the interlayer insulating film 5 and then re-deposited on the edge portion surface of the lower superconductive layer 2. The adhered elements such as La, Sr, Al and Ta were thermally diffused through the forming process of the upper superconductive layer 4 so that the barrier layer 3 was formed to contain at least one of the elements such as La, Sr, Al and Ta.

Figure 3D:
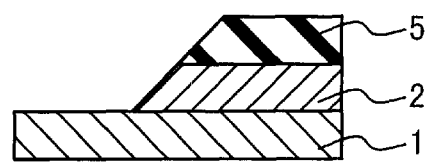

Next, as shown in FIG. 3D, after the etching process, the sample was supersonic-cleaned using acetone and then isopropanol, so that the photoresist layer was dissolved and removed. Finally, the sample was cleaned for 30 minutes in an oxygen plasma activated in 400-W RF.

Figure 3E:
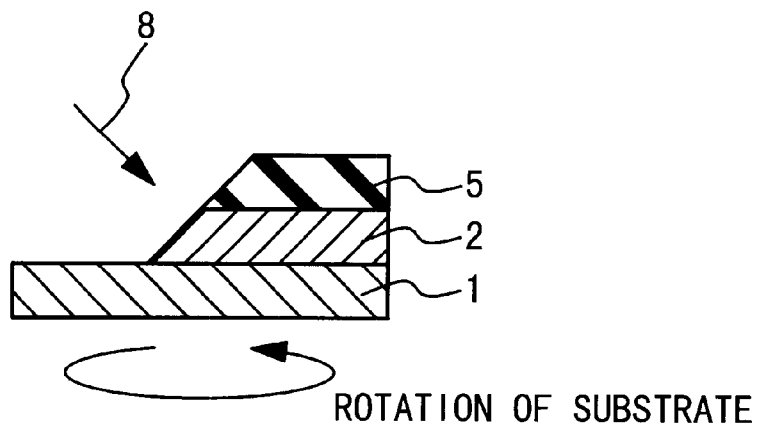

The edge portion surface of the lower superconductive layer was exposed to the atmosphere and organic solvent so that a contaminated layer was formed on the edge portion surface through the photoresist removing process which was carried out in the atmosphere. The contaminated layer was removed through an ion etching process. As shown in FIG. 3E, in this process, Ar ions 8 were irradiated at the angle of about 45 degrees from the substrate surface while the substrate was rotated. Because the incident angle of the Ar ions does not have a large influence to the angle of the edge portion in this etching process, the incident angle may be in a range of approximately 20 to 60 degrees. Also, the ion acceleration voltage was 200 V and the ion current was 15 mA. In order to prevent oxygen depletion from the surface of the superconductive layer edge portion, the etching was carried out while the oxygen activated with the microwave of 2.45 GHz and 120 W was directed at the substrate.

After the etching process, in order to reduce an etching damage to the edge portion surface, a cleaning process by low acceleration ions was carried out while the substrate is rotated. In this case, the ion acceleration voltage was 50 V, the ion current was 10 mA, and the cleaning time was 10 minutes. The activated oxygen was introduced in the cleaning process, too, as described above.

It should be noted that this cleaning process is not an indispensable process to manufacture the high temperature superconductor Josephson junction device with a small spread.

Through the above processes, the same superconductive layer edge portions were formed in 4 directions parallel to [100] or [010] direction of the substrate. The angle of the completed edge portion is about 25 degrees.

After the etching process for removing the contaminated layer ends in an etching chamber, the sample can be transferred to a film growing chamber and is possible to enter a film forming process. Because the etching chamber and the film growing chamber are connected through a transfer tube, the sample can be transferred without exposing the surface of the superconductive layer edge portion to the atmosphere, so that the contamination of the edge portion surface can be prevented.

Figure 3F:
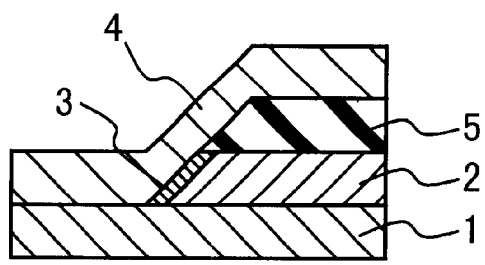

As shown in FIG. 3F, after the substrate temperature was increased to about 700° C. again, the upper superconductive layer 4 of $YBa_2Cu_3O_x$ was grown on this structure to have the film thickness of about 400 nm. The condition at the growth of this layer is the same as that at the growth of the lower superconductive layer 2. Through the above process, the barrier layer 3 was formed between the upper and lower superconductive layers to be composed of the material contains at least four elements of La, Sr, Al and Ta.

Figure 3G:
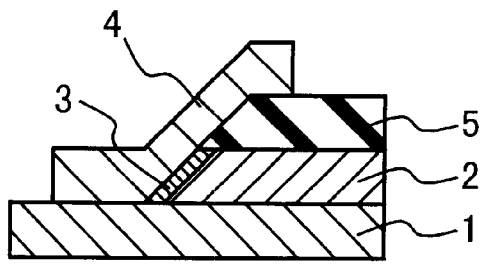

As shown in FIG. 3G, after the upper superconductive layer 4 of $YBa_2Cu_3O_x$ was grown, the sample was cooled for about 1 hour in the oxygen ambience of 500 Torr and then taken out. The upper superconductive layer 4 was processed by the usual lithography method and the ion milling method so as to produce the edge type Josephson junction device in which the upper and lower superconductive layers were connected through the barrier layer 3. Lastly, contact pads are formed through gold deposition and a lift-off method.

The characteristics of the edge type Josephson junction manufactured in this way were evaluated. Either of the samples showed good Josephson characteristics. Shapiro steps appeared in the theoretical voltage in response to microwave irradiation. Also, the periodic modulation of the critical current by magnetic field was observed. The current—voltage characteristic approximately showed an over-dump type characteristic. However, it showed a hysteresis in the low temperature up to about 40 K. The product (IcRn) of the critical current and normal conductive resistance was in a range of about 2 to 2.5 mV at 4.2 K and about 0.1 mV at 60 K. A characteristic spread of the samples was small. The spread of the 12 samples in critical current density is $1\sigma=\pm 6\%$. These values can be obtained through the above-mentioned manufacturing processes, because the high temperature superconductor edge type Josephson junction device is manufactured to have high uniformity.

When the substrate of SrTiO or MgO was used instead of the substrate of LaSrAlTaO, the Josephson junction device was similarly formed. However, the spread of critical current value Ic and the spread of critical current values were both large. Even when the substrate of LaSrAlTaO was used, the critical current value Ic of the junction was extremely large so that the Josephson junction were not formed, if the material of SrTiO, MgO or SrAlTaO was used for the interlayer insulating layer. When the formation of a Josephson junction is tried in these cases, it is necessary to decrease the growth temperature of the upper superconductive layer lower from being general. Therefore, the superconductive characteristic of the upper superconductive layer is degraded. In this way, it is important to use the material containing the elements such as La, Sr, Al and Ta for the interlayer insulating layer which is used for the mask at the time of the ion etching process for the purpose of manufacturing of the Josephson junction device with the small spread of characteristics. If the material containing the elements such as La, Sr, Al and Ta is used for the substrate, it is still desirable.

It should be noted that if a $(La_{0.20}Ca_{0.80})(Al_{0.60}Ta_{0.40})O_3$ target is used instead of the $(La_{0.30}Sr_{0.70})(Al_{0.65}Ta_{0.35})O_3$ target, a LaCaAlTaO interlayer insulating layer is grown instead of the LaSrAlTaO interlayer insulating layer. In this case, the high temperature superconductor Josephson junction with the small spread of the characteristics can be manufactured in the same manner as described above.

Next, FIGS. 4A to 4G show the manufacturing process of the high temperature superconductor sandwich type Josephson junction device according to the third embodiment of the present invention. The high temperature superconductor sandwich type Josephson junction device according to the third embodiment of the present invention will be described below with reference to FIGS. 4A to 4G.

Figure 4A:
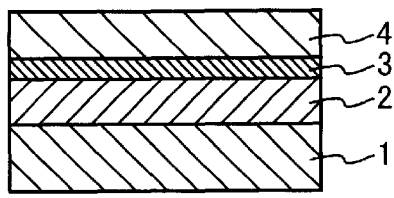
FIGS. 4A to 4G are diagrams of a manufacturing method of the high temperature superconductor sandwich type Josephson junction according to a third embodiment of the present invention.
Figure 4B:
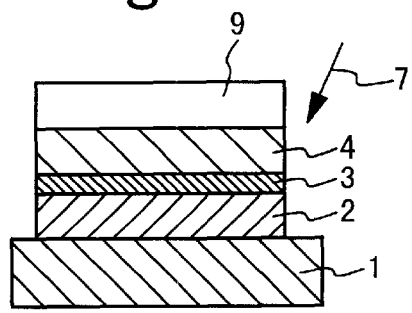

First, a tri-layer thin film growth process will be described. As shown in FIG. 4A, the lower superconductive layer 2 was formed on a substrate 1, the barrier layer 3 was formed on the lower superconductive layer 2, and the upper superconductive layer 4 was formed on the barrier layer 3. Thus, the tri-layer thin film is composed of 3 layers of the lower superconductive layer 2 of $YBa_2Cu_3O_x$, the barrier layer 3 contains elements such as La, Sr, Al and Ta, and the upper superconductive layer 4 of $YBa_2Cu_3O_x$. These thin film layers were grown by the pulsed laser deposition method. The laser is the excimer laser of KrF. The laser wavelength was 248 nm, the laser output was 900 mJ and the laser repetition frequency was 7 Hz. At this time, a sintered target of $YBa_2Cu_3O_x$ was used for growth of the superconductive layers. A single crystal target of LaSrAlTaO was used for the growth of the barrier layer. The composition of the single crystal target was $(La_{0.30}Sr_{0.70})(Al_{0.65}Ta_{0.35})O_3$. Another composition may be used if the composition is in a range of $(La_{0.30\pm0.20}Sr_{0.70\pm0.20})(Al_{0.65\pm0.20}Ta_{0.35\pm0.20})O_{3\pm1}$.

A LaSrAlTaO (100) single crystal was used as the substrate 1. The composition of the substrate was $(La_{0.30}Sr_{0.70})$ $(Al_{0.65}Ta_{0.35})O_3$. Another single crystal of $SrTiO_3$, MgO, $NdGaO_3$ or $LaAlO_3$ may be used for the substrate 1. The substrate surface may have one of planes such as (110) plane displaced from the (100) plane. The size of the substrate was the square of 15 mm×15 mm and the thickness was 0.5 mm. The lower superconductive layer 2 of $YBa_2Cu_3O_x$ was first grown on the substrate 1 in a film growing chamber to have the film thickness of about 300 nm.

The substrate temperature during the growth was about 700° C., and the ambience gas is an oxygen gas and has the oxygen partial pressure of about 200 mTorr. The grown thin film was a c-axis oriented thin film, there was hardly any phase other than $YBa_2Cu_3O_x$ and the surface of the thin film was flat. Also, the superconductor critical temperature Tc is in a range of about 85 to 89 K.

Subsequently, the barrier layer 3 containing the elements such as La, Sr, Al and Ta was grown on the lower superconductive layer 2 in the same condition to have the film thickness from 1 to 2 nm. Last, the upper superconductive layer 4 of $YBa_2Cu_3Ox$ was grown on the barrier layer 3 in the same condition to have the film thickness of about 300 nm. Thus, the tri-layer thin film was formed. After the growth of the tri-layer thin film, the sample was cooled to about 100° C. in the oxygen atmosphere of about 300 Torr.

The thin film growth condition, the thin film thickness, and the target may be changed if the Josephson junction device with good characteristics was obtained. Also, before the barrier layer 3 was deposited, it is preferable that any damage is given to the surface of the lower superconductive layer 2 of $YBa_2Cu_3O_x$ previously through the irradiation of ions such as argon and oxygen. In this case, the ion acceleration voltage is preferably in a range of 50 to 1000 V, more preferably in a range of 50 to 200 V for the Josephson junction device with a high critical current value Ic. The ion irradiation angle may be in the range of 0 to 90 degrees from the substrate surface. In this case, when a damaged region in the surface portion of the lower superconductive layer 2 of $YBa_2Cu_3O_x$ should be shallow, it is preferable to select an angle as small as possible. The substrate temperature in case of ion irradiation may be in a range of room temperature to 700° C. When the ion irradiation is carried out in the low temperature near the room temperature, it is necessary to cool the sample under the condition of the high oxygen partial pressure of about 500 Torr after the lower superconductive layer 2 has been grown. In the case of the sample heating for the growth of the barrier layer after that, it is preferable to keep the high oxygen partial pressure equal to or more than 200 mTorr.

Next, the manufacturing process of the sandwich type Josephson junction device structure will be described.

Figure 4C:
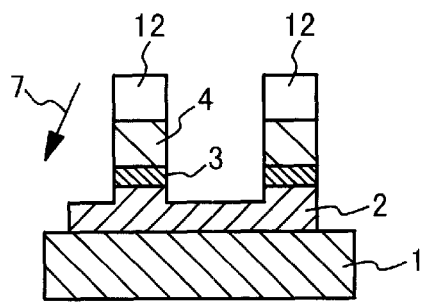

First, as shown in FIG. 4C, a photoresist layer 9 was spin-coated on the 3-layer structure to have the thickness of about 1.2 $\mu$m and then was patterned by use of the usual photolithography method. The upper superconductive layer 4, the barrier layer 3 and the lower superconductive layer 2 were etched by an ion etching method using the patterned photoresist as a mask. Thus, lower superconductive layer wiring patterns were determined. In this case, the patterned photoresist layer was removed. Subsequently, another photoresist layer was spin-coated onto the 3-layer structure and then was patterned by the photolithography method. The shape of the sandwich type Josephson junction device was determined by the ion etching method using the patterned photoresist layer as a mask. In this way, the Josephson junction device having 2 or more Josephson junctions, 2 Josephson junctions in this example were formed.

In this case, the lower superconductive layer 2 was over-etched by about 50 nm in depth after the etching of the barrier layer was ended.

Figure 4D:
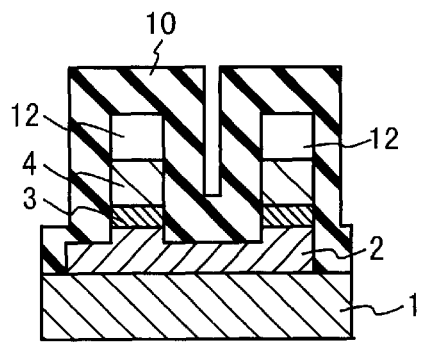

As shown in FIG. 4D, after the etching ended, an interlayer insulating layer 10 of $SrTiO_3$ was deposited on the sample as the patterned photoresist layer was left, to have the film thickness of about 400 nm. The interlayer insulating layer 10 was grown by the pulsed laser deposition method at a temperature near the room temperature intentionally without substrate heating. The laser was the excimer laser of KrF. The laser wavelength was 248 nm, the laser output was 900 mJ and the laser repetition frequency was 7 Hz. A single crystal of the composition of $SrTiO_3$ was used for the target. Another material such as MgO, $LaAlO_3$, $NdGaO_3$, and $Y_2O_3$ may be used for the interlayer insulating layer 10.

Figure 4E:
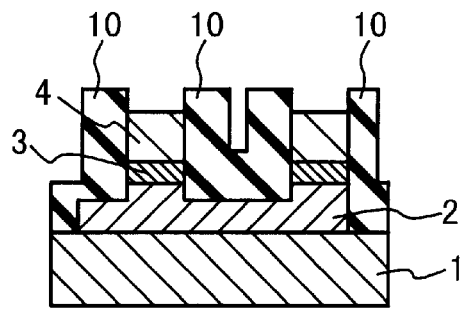

As shown in FIG. 4E, after the interlayer insulating layer was deposited, the patterned photoresist layer which was used to determine the junction shape was removed with solvent. As a result, a part of the interlayer insulating layer was removed by use of the principle of a lift-off process.

Last, upper layer normal conductive wiring lines and contact pads were formed of gold.

Figure 4F:
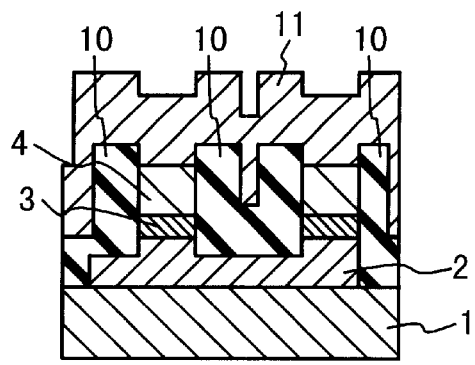

As shown in FIG. 4F, a gold thin film 11 was deposited on the sample to have the film thickness of about 400 nm.

Figure 4G:
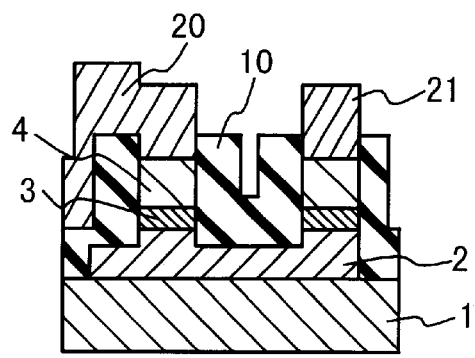

Subsequently, as shown in FIG. 4G, the gold thin film 11 was patterned by the ion etching method using a patterned photoresist as a mask, which was obtained by patterning a photoresist layer by the usual photolithography process. Thus, a normal conductive wiring line and contact pad 20 connected with the upper superconductive layer 4 and a contact pad 21 connected with the lower superconductive layer 2 were formed.

In this way, the sandwich type Josephson junction device is completed.

The characteristics of the sandwich type Josephson junction device manufactured in this way were evaluated. When the deposited barrier layer had a film thickness equal to or smaller than 2 nm, either of the samples showed good Josephson characteristics. Shapiro steps appeared in the theoretical voltage in response to microwave irradiation. Also, the periodic modulation of the critical current by magnetic field was observed. The current—voltage characteristic approximately showed an over-dump type characteristic. However, it showed a hysteresis in the low temperature up to about 40 K. The product (IcRn) of the critical current and normal conductive resistance was in a range of about 1 to 2 mV at 4.2 K and about 0.1 mV at 60 K. A characteristic spread of the samples was small. The spread of the 12 samples in critical current density is $1\sigma=\pm5\%$. These values can be obtained through the above-mentioned manufacturing processes, because the high temperature superconductor sandwich type Josephson junction device is manufactured to have high uniformity.

It should be noted that the analyzed results can be applied to the second and third embodiments.

As described above, according to the present invention, it is possible to form the barrier layer with the high uniformity between the YBaCuO lower superconductive layer and the YBaCuO upper superconductive layer. Thus, the high temperature superconductor Josephson junction device showing the high uniformity in the characteristic can be realized. Therefore, the application to various superconductor devices and circuits is possible.

Also, according to the present invention, the process of depositing the barrier layer is not always necessary in the high temperature superconductor Josephson junction device. Therefore, it is possible to simplify the manufacturing processes.

What is claimed is:

1. A Josephson junction comprising:
    a first superconductive layer formed on a substrate and having an inclination portion;
    an insulating film formed on said first superconductive layer and having an inclination portion following to said inclination portion of said first superconductive layer;
    a barrier layer formed on said inclination portion of said first superconductive layer;
    a second superconductive layer formed on said inclination portion of said insulating film and said inclination portion of said barrier layer;
    wherein said barrier layer has a perovskite structure; and
    wherein a material of said barrier layer has a lattice constant from 0.41 nm to 0.43 nm.

2. A Josephson junction according to claim 1, wherein said insulating film contains at least one element selected from the group consisting of La, Sr, Al, Ca and Ta.

3. A Josephson junction comprising:
    a first superconductive layer formed on a substrate and having an inclination portion;
    an insulating film formed on said first superconductive layer and having an inclination portion following to said inclination portion of said first superconductive layer;
    a barrier layer formed on said inclination portion of said first superconductive layer;
    a second superconductive layer formed on said inclination portion of said insulating film and said inclination portion of said barrier layer; and
    wherein a composition of said barrier layer is $Y_{1-x}Ba_1Cu_xO_y$ (x being in a range of 0 to 1).

4. A Josephson junction according to claim 3, wherein said x is equal to or less than 0.5.

5. A Josephson junction according to claim 4, wherein said x is 0.

6. A Josephson junction device comprising:
    a first superconductive layer formed on a substrate;
    2 or more interlayer insulating films provided on said first superconductive layer apart from each other; and
    2 or more second superconductive layers respectively formed on said interlayer insulating layers;
    wherein each of said interlayer insulating films has a film thickness equal to or less than 2 nm.; and
    said first superconductive layer and said second superconductive layer are YBaCuO superconductive layers.

7. A Josephson junction according to claim 1, wherein said substrate contains at least one element selected from the group consisting of La, Sr, Al, Ca and Ta.

8. A Josephson junction according to claim 3, wherein said insulating film contains at least one element selected from the group consisting of La, Sr, Al, Ca and Ta.

9. A Josephson junction according to claim 3, wherein said substrate contains at least one element selected from the group consisting of La, Sr, Al, Ca and Ta.

10. A Josephson junction according to claim 1, wherein said barrier layer is composed of one layer being composed of the material which contains at least one of the elements such as La, Sr, Ca, Al and Ta, and the other layer being formed with at least one of the said elements diffused in the lower superconductive layer.

11. A Josephson junction according to claim 3, wherein said barrier layer is composed of one layer being composed of the material which contains at least one of the elements such as La, Sr, Ca, Al and Ta, and the other layer being formed with at least one of the said elements diffused in the lower superconductive layer.

* * * * *

UNITED STATES PATENT AND TRADEMARK OFFICE
CERTIFICATE OF CORRECTION

PATENT NO. : 6,541,789 B1
DATED : April 1, 2003
INVENTOR(S) : Tetsuro Sato et al.

It is certified that error appears in the above-identified patent and that said Letters Patent is hereby corrected as shown below:

<u>Title page,</u>
Item [73], Assignee, "NEC Corporation, Tokyo (JP)" should read -- NEC Corporation, Tokyo (JP) and International Superconductivity Technology Center, Tokyo (JP) --

Signed and Sealed this

Twenty-sixth Day of August, 2003

JAMES E. ROGAN
*Director of the United States Patent and Trademark Office*